US012648217B2

(12) United States Patent
Kim et al.

(10) Patent No.: US 12,648,217 B2
(45) Date of Patent: Jun. 2, 2026

(54) SEMICONDUCTOR DEVICE

(71) Applicant: Infineon Technologies Austria AG,
Villach (AT)

(72) Inventors: Hyeongnam Kim, Chandler, AZ (US);
Mohamed Imam, Tempe, AZ (US)

(73) Assignee: Infineon Technologies Austria AG,
Villach (AT)

( * ) Notice: Subject to any disclaimer, the term of this
patent is extended or adjusted under 35
U.S.C. 154(b) by 468 days.

(21) Appl. No.: 18/458,627

(22) Filed: Aug. 30, 2023

(65) Prior Publication Data
US 2024/0088138 A1      Mar. 14, 2024

(30) Foreign Application Priority Data

Sep. 1, 2022      (EP) .................................... 22193542

(51) Int. Cl.
*H03K 17/56* (2006.01)
*H10D 8/60* (2025.01)
*H10D 30/47* (2025.01)
*H10D 62/85* (2025.01)
*H10D 84/80* (2025.01)
(52) U.S. Cl.
CPC ........... *H10D 84/811* (2025.01); *H03K 17/56*
(2013.01); *H10D 8/60* (2025.01); *H10D*
*30/475* (2025.01); *H10D 62/8503* (2025.01)
(58) Field of Classification Search
CPC ............... H03K 17/56; H03K 17/6874; H03K
2217/0009; H03K 2217/0018; H10D
84/811; H10D 89/611; H10D 30/471;
H10D 30/472; H10D 30/473; H10D
30/4732; H10D 30/4735; H10D 30/4738;
H10D 30/474; H10D 30/475; H10D
30/4755; H10D 30/476; H10D 30/477;
H10D 30/478; H10D 62/824
See application file for complete search history.

(56) References Cited

U.S. PATENT DOCUMENTS

2019/0006499 A1* 1/2019 Kinoshita .............. H10D 84/05
2019/0068181 A1* 2/2019 Leong .................. H03K 17/161
(Continued)

FOREIGN PATENT DOCUMENTS

EP          3562040 A1   10/2019

*Primary Examiner* — Eric A. Ward
(74) *Attorney, Agent, or Firm* — Murphy, Bilak &
Homiller, PLLC

(57) ABSTRACT
In an embodiment, a semiconductor device includes: a main
bi-directional switch formed on a semiconductor substrate
and including first and second gates, a first source electri-
cally connected to a first voltage terminal, a second source
electrically connected to a second voltage terminal, and a
common drain; and a substrate control circuit. The substrate
control circuit includes: a first diode and a second diode; a
discharge circuit including a first transistor and a second
transistor connected in a common source configuration to
the semiconductor substrate; and a gate potential control
circuit including a third diode and a fourth diode. The first
diode has a forward voltage $Vf_1$ and the third diode has a
forward voltage $Vf_3$, where $Vf_1 \geq 1.1Vf_4$ or $Vf_1 \geq 1.2Vf_4$ or
$Vf_1 \geq 1.5Vf_4$ or $Vf_1 \geq 2Vf_4$.

15 Claims, 14 Drawing Sheets

(56)                    References Cited

U.S. PATENT DOCUMENTS

2019/0326280 A1 *  10/2019  Imam ....................... H10D 8/00
2022/0416784 A1 *  12/2022  Harrison .......... H03K 17/08142
2023/0112152 A1 *   4/2023  Sharma .............. H03K 17/6871
                                                                       327/427
2024/0072161 A1 *   2/2024  Sharma ................ H03K 17/687

* cited by examiner

SEMICONDUCTOR DEVICE

BACKGROUND

To date, transistors used in power electronic applications have typically been fabricated with silicon (Si) semiconductor materials. Group III-N semiconductor devices, such as gallium nitride (GaN) devices, are now emerging as attractive candidates to carry large currents, support high voltages and to provide very low on-resistance and fast switching times.

A popular configuration for realizing a bi-directional switch in a monolithic device is to use two separate gates with a common drain. The monolithic bi-directional switch is typically implemented in a substrate, where each of the two gates has its own gate driver. The common drain configuration has a source at either end of the monolithic device, meaning that a source connection to the substrate is not an option for the bi-directional switch. If the substrate is kept floating and one of the two sources is biased at a high voltage, that source in conjunction with the adjacent gate acts as an extended drain and thus follows the high potential. The substrate should be kept as close to ground potential during on-state as possible for stable bi-directional device operation. Conventionally, two back-to-back diodes are integrated with their anodes connected to the substrate and each cathode connected to either end of the sources. However, such a back-to-back diode implementation does not hold the substrate voltage to the desired (close to 0V) voltage during the on-state of the bi-directional switch and thus degrades device performance. Instead, the substrate experiences a large negative potential because negative charge stored in the substrate during the off-state of the bi-directional switch is confined to the substrate which is in the middle point of the back-to-back diode. This confinement is induced by either diode in the back-to-back diodes initially forward-biased during the off-state of the bi-directional switch but changed to the blocking mode when the bi-directional device switches from the off-state to the on-state. Hence, there is a need for a more effective monolithic solution for providing a discharge path for the substrate during the off-to-on switching of a bi-directional switch.

EP 3562040 A1 discloses a main bi-directional switch formed on a semiconductor substrate and having a common drain configuration. A discharge circuit having a plurality of individual transistors or an auxiliary bi-directional switch is monolithically integrated with the main bi-directional switch and connected in a common source configuration to the semiconductor substrate. The gates of the transistors or auxiliary bi-directional switch of the discharge circuit are decoupled from gate drive circuitry so that the first and the second gates are controlled at least passively and based on a state of the main bi-directional switch.

However, further improvements to discharge circuits for bi-directional switches are desirable.

SUMMARY

According to the invention, a semiconductor device is provided that comprises a main bi-directional switch formed on a semiconductor substrate and a substrate control circuit. The main bi-directional switch comprises first and second gates, a first source electrically connected to a first voltage terminal and a second source electrically connected to a second voltage terminal. The substrate control circuit comprises a first diode and a second diode, a discharge circuit, and a gate potential control circuit. The anode of the first diode and the anode of the second diode are connected to the semiconductor substrate. The cathode of the first diode is connected to the first source of the main bi-directional switch and the cathode of the second diode is connected to the second source of the main bi-directional switch. The discharge circuit comprises a first transistor and a second transistor connected in a common source configuration to the semiconductor substrate. A first drain of the first transistor is connected to the first source of the main bi-directional switch and a second drain of the second transistor is connected to the second source of the main bi-directional switch. The gate potential control circuit comprises a third diode and a fourth diode.

In one alternative configuration, the anode of the third diode is connected to a second gate of the second transistor and the cathode of the third diode is connected to the first source of the main bi-directional switch. The anode of the fourth diode is connected to a first gate of the first transistor and the cathode of the fourth diode is connected to the second source of the main bi-directional switch. The first diode has a forward voltage $Vf_1$ and the third diode has a forward voltage $Vf_3$, wherein $Vf_1 \geq 1.1Vf_3$ or $Vf_1 \geq 1.2Vf_3$ or $Vf_1 \geq 1.5Vf_3$ or $Vf_1 \geq 2Vf_3$.

In another alternative configuration, the anode of the third diode is connected to a first gate of the first transistor and the cathode of the third diode is connected to the second source of the main bi-directional switch. The anode of the fourth diode is connected to a second gate of the second transistor and the cathode of the fourth diode is connected to the first source of the main bi-directional switch. The first diode has a forward voltage $Vf_1$ and the fourth diode has a forward voltage $Vf_4$, wherein $Vf_1 \geq 1.1Vf_4$ or $Vf_1 \geq 1.2Vf_4$ or $Vf_1 \geq 1.5Vf_4$ or $Vf_1 \geq 2Vf_4$.

In another alternative configuration, the anode of the third diode is connected to a first gate of the first transistor and the cathode of the third diode is connected to the first source of the main bi-directional switch. The anode of the fourth diode is connected to a second gate of the second transistor and the cathode of the fourth diode is connected to the second source of the main bi-directional switch. The first diode (SD1) has a forward voltage $Vf_1$ and the third diode (QD1) has a forward voltage $Vf_3$, wherein $Vf_1 \geq 1.1Vf_3$ or $Vf_1 \geq 1.2Vf_3$ or $Vf_1 \geq 1.5Vf_3$ or $Vf_1 \geq 2Vf_3$.

The forward voltage of a diode is the voltage drop across the diode when current flows through the diode, or another words it is the voltage required across the diode so that the diode turns on and conducts current in the forward direction.

In some embodiments, for all alternative configurations, the ratio between the forward voltage of the first and third diodes and the ratio between the first and fourth diodes hold, i.e. $Vf_1 \geq 1.1Vf_3$ or $Vf_1 \geq 1.2Vf_3$ or $Vf_1 \geq 1.5Vf_3$ or $Vf_1 \geq 2Vf_3$ and $Vf_1 \geq 1.1Vf_4$ or $Vf_1 \geq 1.2Vf_4$ or $Vf_1 \geq 1.5Vf_4$ or $Vf_1 \geq 2Vf_4$.

In some embodiments, the second diode has a forward voltage $Vf_2$ and the fourth diode has a forward voltage $Vf_4$, wherein $Vf_2 \geq 1.1Vf_4$ or $Vf_2 \geq 1.2Vf_4$ or $Vf_2 \geq 1.5Vf_4$ or $Vf_2 \geq 2Vf_4$ and/or the second diode has a forward voltage $Vf_2$ and the third diode has a forward voltage $Vf_3$, wherein $Vf_2 \geq 1.1Vf_3$ or $Vf_2 \geq 1.2Vf_3$ or $Vf_2 \geq 1.5Vf_3$ or $Vf_2 \geq 2Vf_3$.

The maximum difference which can arise from material and processing variations is $Vf_1 \geq 1.05Vf_4$ and $Vf_1 \geq 1.05Vf_3$ and $Vf_2 \geq 1.05Vf_3$ $Vf_2 \geq 1.05Vf_4$. Therefore, the larger forward voltage of one or both of the first and second diodes compared to the forward voltage of the third and fourth diodes is greater than that arising from material and processing variations.

The substrate control circuit serves to provide a substrate stabilization circuit by eliminating substrate charging effects. In order to further increase the robustness over the long term and further reduce the risk of leakage current during the off-state of the bi-directional switch, the first diode is provided with a forward voltage that is larger than the forward voltage of the third diode, also when taking into consideration material and process variations which can lead to a variation in the forward voltage of the diodes from the pre-determined expected value. In other words, the minimum difference between the larger forward voltage of one or both of the back-to-back diode(s) of the substate control circuit, e.g. $Vf_1$ of the first diode, and the smaller forward voltage of one or both of the diodes of the gate potential control circuit, e.g. $Vf_3$ of the third diode, is greater than that which could arise from material and process variations. Consequently, the risk of inducing a weak sub-threshold region of the transistors in the discharge circuit, which can lead to leakage current of the bi-directional switch in the off state, can be avoided.

For example, a situation in which $Vf_1$ of the first diode is smaller than the forward voltage $Vf_4$ of the fourth diode at high VS2 of the bi-directional switch can lead to a slightly positive $V_{GS}$ (e.g., 0.5V) while $V_{TH}$ of the transistor (QC2) is only 1V~1.5V. As a result, the transistor (QC2) can operate at subthreshold region and suffer from high leakage current at high $V_{S2}$ and the long-term lifetime will be degraded. This is avoided by providing a $V_{F1}$ of the first diode that is greater than $Vf_4$ of the fourth diode and/or by providing a $V_{F2}$ of the second diode that is greater than $Vf_3$ of the third diode so that $V_{GS}$ of the transistor is negative and then the substrate control circuit will be safe under the off-state and the reliability of the semiconductor device over longer time periods is improved. In some embodiments, the forward voltage of both the first and second diode is greater than the forward voltage of the third diode and the fourth diode.

In some embodiments, the substrate control circuit is monolithically integrated with the main bi-directional switch in a common body.

In some embodiments, the semiconductor substrate comprises a Group III nitride body arranged on a base substrate and the bi-directional switch, the first and second transistors and the first, second, third and fourth diodes are monolithically integrated into the Group III nitride body.

The first and second diode may usefully be formed as a two-terminal device, i.e. with an anode terminal and a cathode terminal, rather than having a gated diode transistor structure, as a two terminal device tends to have a larger forward voltage than a gated diode device.

In some embodiments, the third diode and the fourth diode each have a gated diode structure and comprise a transistor structure having a source, a gate, and a drain, wherein the anode is provided by the gate connected to the source and the cathode is provided by the drain.

In some embodiments, the first diode and the second diode each comprise an anode comprising a p-doped region arranged on an upper surface of the Group III nitride body and a first metallic electrode arranged on the p-doped region and the cathode comprises a second metallic electrode arranged on the upper surface of the Group III nitride body.

In some embodiments, the first and second diode each further comprise a p-doped region coupled to the cathode.

In some embodiments, the anode and/or cathode of each of the first and the second diode further comprises a field plate.

In some embodiments, the p-doped region of the anode is at least partially arranged in a recess in the upper surface of the Group III nitride body.

In some embodiments, the semiconductor device further comprises an isolation region electrically insulating the first and second diodes from one another.

In some embodiments, the first and the second diode are each a pn diode or a Schottky diode.

In some embodiments, the first diode and the second diode each comprise two or more diode stages that are electrically connected in series in order to increase the forward voltage. Each diode stage has a two terminal structure and may have the two terminal structure according to any one of the embodiments of the first and second diode described herein.

In some embodiments, the first diode and the second diode each comprise two or more diode stages that are electrically connected in series in order to increase the forward voltage and the first diode and the second diode each comprise a transistor structure having a source, a gate and a drain, wherein the anode is provided by the gate connected to the source and the cathode is provided by the drain.

In some embodiments, the semiconductor device further comprises a metallization structure arranged on the upper surface of the Group III nitride body. The metallization structure comprises a first voltage terminal pad providing the first voltage terminal, a second voltage terminal pad providing the second voltage terminal and a substrate pad connected to the anode of the first diode, the anode of the second diode and the common source of the first and second transistor.

In some embodiments, the Group III nitride body comprises a multilayer structure comprising a Group III nitride channel layer and a Group III nitride barrier layer arranged on the Group III nitride channel layer and forming a heterojunction therebetween capable of supporting a two-dimensional charge gas.

In some embodiments, the channel layer is formed of GaN and the barrier layer is formed of $Al_xGa_{(1-x)}N$, where $0<x<1$.

In some embodiments, the bi-directional switch is formed from two transistor devices, e.g. High Electron Mobility Transistors (HEMTs), having a common drain configuration. The two transistor devices may be enhancement mode or depletion mode devices.

The two transistor devices of the substrate control circuit may be enhancement mode or depletion mode devices and may be HEMTs.

In some embodiments, the Group III nitride body is arranged on a base substrate that has a growth surface that is capable of supporting the epitaxial growth of one or more Group III nitride-base layers.

In some embodiments, the multilayer structure of the Group III nitride body further comprises a buffer structure on the base substrate and the channel layer is arranged on the buffer structure.

In some embodiments, the Group III nitride body further comprises a back barrier layer that is formed between the buffer structure and the channel layer. The channel layer is formed on the back barrier layer and forms a second heterojunction with the back barrier layer.

In some embodiments, the base substrate is formed of monocrystalline silicon or an epitaxial silicon layer, sapphire, ceramic substrate, or SiC substrate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Exemplary embodiments are depicted in the drawings and are detailed in the description which follows.

DETAILED DESCRIPTION

Figure 1A:
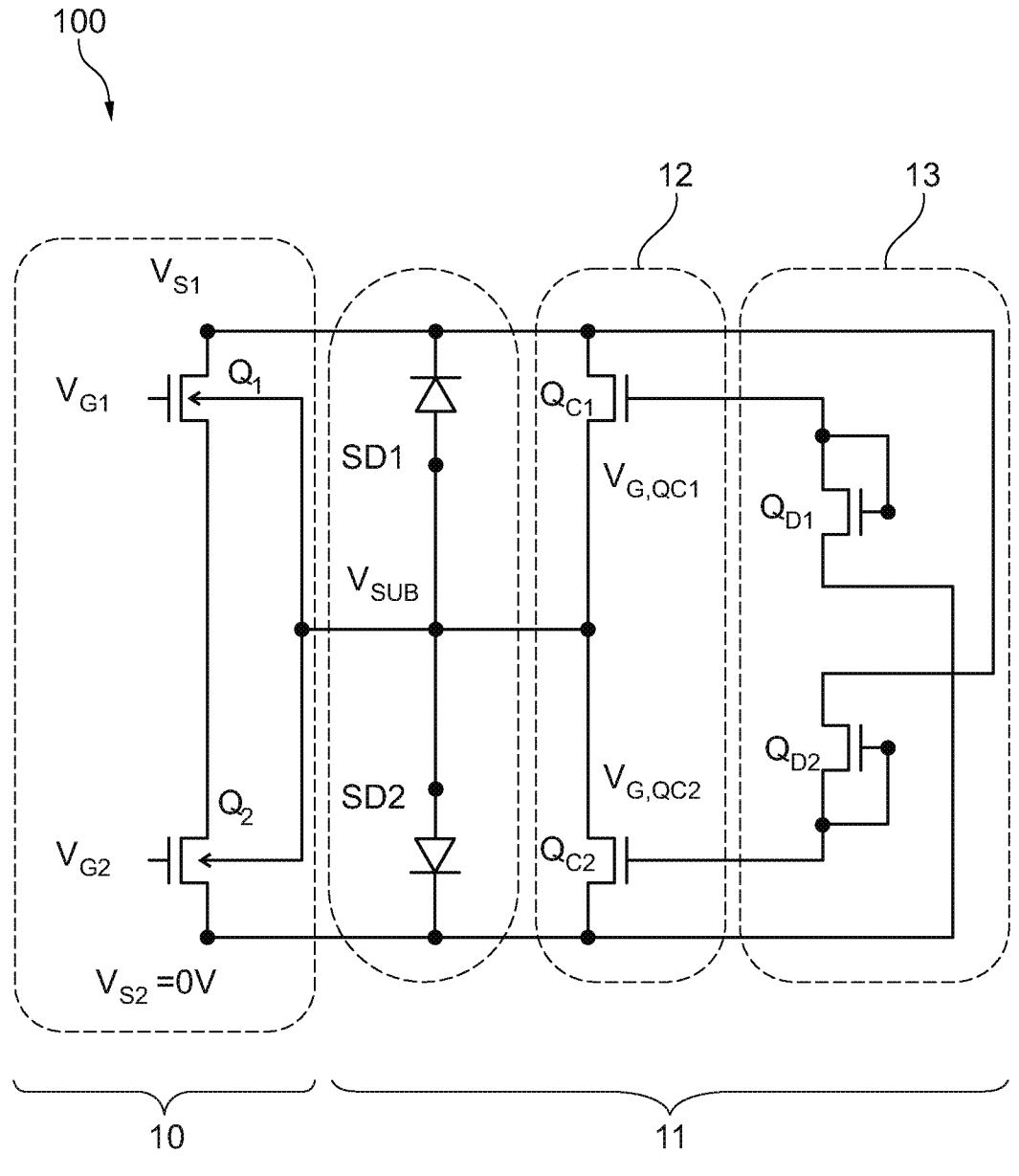
FIG. 1A illustrates a circuit diagram of a semiconductor device with a main bi-directional switch and a substrate control circuit according to an embodiment.

In the following detailed description, reference is made to the accompanying drawings, which form a part hereof, and in which is shown by way of illustration specific embodiments in which the invention may be practiced. In this regard, directional terminology, such as "top", "bottom", "front", "back", "leading", "trailing", etc., is used with reference to the orientation of the figure(s) being described. Because components of the embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, thereof, is not to be taken in a limiting sense, and the scope of the present invention is defined by the appended claims.

A number of exemplary embodiments will be explained below. In this case, identical structural features are identified by identical or similar reference symbols in the figures. In the context of the present description, "lateral" or "lateral direction" should be understood to mean a direction or extent that runs generally parallel to the lateral extent of a semiconductor material or semiconductor carrier. The lateral direction thus extends generally parallel to these surfaces or sides. In contrast thereto, the term "vertical" or "vertical direction" is understood to mean a direction that runs generally perpendicular to these surfaces or sides and thus to the lateral direction. The vertical direction therefore runs in the thickness direction of the semiconductor material or semiconductor carrier.

As employed in this specification, when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present.

As employed in this specification, when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A depletion-mode device, such as a depletion-mode transistor, has a negative threshold voltage which means that it can conduct current at zero gate voltage. These devices are normally on. An enhancement-mode device, such as an enhancement-mode transistor, has a positive threshold voltage which means that it cannot conduct current at zero gate voltage and is normally off. An enhancement-mode device is not limited to low voltages and may also be a high-voltage device.

As used herein, the phrase "Group III-Nitride" refers to a compound semiconductor that includes nitrogen (N) and at least one Group III element, including aluminum (Al), gallium (Ga), indium (In), and boron (B), and including but not limited to any of its alloys, such as aluminum gallium nitride ($Al_xGa_{(1-x)}N$), indium gallium nitride ($In_yGa_{(1-y)}N$), aluminum indium gallium nitride ($Al_xIn_yGa_{(1-x-y)}N$), gallium arsenide phosphide nitride ($GaAs_aP_bN_{(1-a-b)}$), and aluminum indium gallium arsenide phosphide nitride ($Al_xIn_yGa_{(1-x-y)}As_aP_bN_{(1-a-b)}$), for example. Aluminum gallium nitride and AlGaN refers to an alloy described by the formula $Al_xGa_{(1-x)}N$, where $0<x<1$.

FIG. 1A illustrates a circuit diagram of a semiconductor device 100 that comprises a main bi-directional switch 10 formed on a semiconductor substrate and a substrate control circuit 11. The substrate control circuit 11 may be mono-lithically integrated in the semiconductor substrate along with the bi-directional switch 10.

The main bi-directional switch 10 is formed by two lateral transistor devices Q1, Q2 which have a common drain D. The lateral transistor devices Q1, Q2 may be enhancement mode devices or depletion mode devices. The bi-directional switch 10 comprises first and second gates G1, G2, a first source S1 electrically connected to a first voltage terminal VS1, a second source S2 electrically connected to a second voltage terminal VS2.

The main bi-directional switch 10 has four primary operational states: OFF/OFF in which both gates G1, G2 of the main bi-directional switch 10 are off; ON/ON in which both gates G1, G2 of the main bi-directional switch 10 are on; ON/OFF in which the first gate G1 of the main bi-directional switch 100 is on and the second gate G2 of the main bi-directional switch 10 is off; and OFF/ON in which the first gate G1 of the main bi-directional switch 10 is off and the second gate G2 of the main bi-directional switch 10 is on. The typical operation of a bi-directional switch includes transitioning from ON/OFF to ON/ON, and from OFF/ON to ON/ON. The current flow direction depends on the polarity across the first and second voltage terminals VS1, VS2. The current flow direction can be reversed by changing the polarity.

The substrate control circuit 11 comprises a first diode SD1 and a second diode SD2, a discharge circuit 12 and a gate potential control circuit 13. The first and second diodes SD1 and SD2 are connected back-to-back with the anode of the first diode SD1 and the anode of the second diode SD2 connected to the semiconductor substrate and VSUB. The cathode of the first diode SD1 is connected to the first source S1 of the main bi-directional switch 10 and VS1 and the cathode of the second diode SD2 is connected to the second source S2 of the main bi-directional switch 10 and VS2.

The discharge circuit 12 comprises a first transistor QC1 and a second transistor QC2 connected in a common source configuration to the semiconductor substrate VSUB. A first drain of the first transistor QC1 is connected to the first source of the main bi-directional switch 10 and VS1 and a second drain of the second transistor QC2 is connected to the second source of the main bi-directional switch 10 and VS2.

The gate potential control circuit 13 comprises a third diode QD1 and a fourth diode QD2. The anode of the third diode QD1 is connected to a first gate of the first transistor QC1 and the cathode of the first diode QD1 is connected to the second source of the main bi-directional switch 10 and VS2. The anode of the fourth diode QD2 is connected to a second gate of the second transistor QC2 and the cathode of the second diode QD2 is connected to the first source of the main bi-directional switch 10 and VS1.

The first diode SD1 has a forward voltage $Vf_1$, the second diode has a forward voltage $Vf_2$, the third diode QD1 has a forward voltage $Vf_1$ and the fourth diode has a forward voltage $Vf_4$. The forward voltage $Vf_1$ of the first diode SD1 is greater than the forward voltage $Vf_4$ of the fourth diode, wherein the difference between $Vf_1$ and $Vf_4$ is greater than that occurring from processing variations. In some embodiments, $Vf_1 \geq 1.1 Vf_4$ since process variations lead to a maximum difference between $Vf_1$ and $Vf_4$ of 1.05 $Vf_4$. In some embodiments, the increased forward voltage of the first diode over the fourth diode is greater so that $Vf_1 \geq 1.2 Vf_4$ or $Vf_1 \geq 1.5 Vf_4$ or $Vf_1 \geq 2 Vf_4$.

The substrate control circuit 11 serves to provide a substrate stabilization circuit by eliminating substrate charging effects. The discharge circuit 11 provides a discharge path for the semiconductor substrate during the off-to-on switching of the main bi-directional switch 10.

In the off-state (ON/OFF or OFF/ON), the gates G1 and G2 of the main bi-directional switch 10 are on and off, respectively, and the main bi-directional switch 10 is in a blocking state. Under this condition, a relatively high voltage is applied at the first voltage terminal VS1, the first and second transistors QC1 and QC2 are not conducting, and most of the source voltage appears across main transistor Q2 and the first transistor QC1. If instead the source voltage is applied at the second voltage terminal VS2, the first and second transistors QC1 and QC2 are still not conducting and most of the source voltage appears across main transistor Q1 and the second transistor QC2.

When the main bi-directional switch 100 transitions from the off-state (ON/OFF or OFF/ON) to the on-state (ON/ON), a current channel forms in the main bi-directional switch 10 and practically no voltage drop occurs across the switch 10. Some of the stored charge in main transistors Q1 and Q2 of the bi-directional switch 10 and first and second transistors QC1 or QC2 discharges through the main transistors Q1 and Q2. In addition, the other stored charge discharges through the first and second transistors QC1 and QC2 since both are on instantaneously or almost instantaneously during the off-to-on switching. For example, when the source voltage of the first voltage terminal VS1 changes from high positive voltage to low positive voltage, in other words, when Q2 switches from off to on and Q1 remains on, the gates of the first and second transistors QC1 and QC2 become more positive with respect to their common source terminal S which causes the first and second transistors QC1 and QC2 to turn on, thereby providing a discharge path for the stored charge in the semiconductor substrate and debiasing the substrate to 0V or close to 0V.

The gates of the first and second transistors QC1, QC2 of the discharge circuit are each decoupled from gate drive circuitry and controlled at least passively and based on a state of the main bi-directional switch 10. No additional gate drivers, auxiliary supplies or control components are required to ensure proper operation of the first and second transistors QC1, QC2, thus providing a fundamentally passive solution for holding the semiconductor substrate of the bi-directional switch 11 at a desired voltage during the on-state of the bi-directional switch 10. The third and fourth diodes QD1, QD2 ensure that the first and second transistors QC1, QC2 block the voltage when the main bi-directional switch is off or discharge the stored charge when the main bi-directional switch.

The second diode SD2 is provided with a forward voltage that is larger than the forward voltage of the third diode QD1, also when taking into consideration material and process variations which can lead to a variation in the forward voltage of the diodes, including the second diode SD2 and the third diode QD1, from the pre-determined expected value. This relationship of the forward voltages increases the robustness of the semiconductor device 100 over the long term and reduces the risk of leakage current during the off-state of the bi-directional switch 10. Consequently, the risk of inducing a weak sub-threshold region of the FETs in the discharge circuit 12, which can lead to leakage current of the substrate control circuit 11 in the off state of the main bi-directional switch, is avoided.

For example, a situation in which $V_F$ of the second diode SD2 is smaller than that of the third diode QD1 at high VS1 of the bi-directional switch 10 can lead to a slightly positive $V_{GS}$ (e.g., 0.5V) while $V_{TH}$ of the first transistor QC1 is only 1V~1.5V. As a result, the first transistor can operate at subthreshold region and suffer from high leakage current at high VS1 and the long-term lifetime will be degraded. This is avoided by providing a forward voltage ($V_F$) of the second diode SD2 that is greater than the forward voltage of the third diode QD1 so that $V_{GS}$ of the first transistor QC1 is negative and then the substrate control circuit 11 will be safely under the off-state and the reliability of the semiconductor device 100 over longer time periods is improved.

In some embodiments, the forward voltage $Vf_1$ of the first diode SD1 is greater than the forward voltage $Vf_4$ of the fourth diode QD2 wherein the difference between $Vf_1$ and $Vf_4$ is greater than that occurring from processing variations. In some embodiments, $Vf_1 \geq 1.1 Vf_4$, since process variations lead to a difference between $Vf_1$ and $Vf_4$ of less than 1.05 $Vf_4$. In some embodiments, $Vf_1 \geq 1.1 Vf_4$ or $Vf_1 \geq 1.2 Vf_4$ or $Vf_1 \geq 1.5 Vf_4$ or $Vf_1 \geq 2 Vf_4$.

In some embodiments, the forward voltage $Vf_1$ of the first diode SD1 is also greater than the forward voltage $Vf_3$ of the third diode QD1, so that $Vf_1 \geq 1.1 Vf_3$ or $Vf_1 \geq 1.2 Vf_3$ or $Vf_1 \geq 1.5 Vf_3$ or $Vf_1 \geq 2 Vf_3$ and additionally the forward voltage $Vf_2$ of the second diode SD2 is greater than the forward voltage $Vf_4$ of the fourth diode QD2 so that $Vf_2 \geq 1.1 Vf_4$ or $Vf_2 \geq 1.2 Vf_4$ or $Vf_2 \geq 1.5 Vf_4$ $Vf_2 \geq 2 Vf_4$.

For example, $V_{F1}$ of the first diode SD1 may be in the range of 2.8V~3.5V and $Vf_4$ of the fourth diode QD2 may lie in the range of 1V~1.5V. Similarly, the forward voltage $Vf_2$ of the second diode SD2 may be in the range of 2.8V~3.5V and $Vf_3$ of the third diode QD1 may lie in the range of 1V~1.5V.

The difference between the higher forward voltage of the first and second diodes SD1, SD2 and the third and fourth diodes QD1, QD2 is greater than the threshold voltage VTH of the first and second transistors QC1, QC2.

The first and second transistors QC1, QC2 may be normally off or normally on transistor devices, for example HEMTs. In some embodiments, the main bi-directional switch 10 and the substate control circuit 11 are monolithically integrated into a common semiconductor body, in particular a Group III nitride body that is arranged on a base substrate.

In some embodiments, the first and second diode may be formed by a two terminal diode structure, such as a p-GaN/AlGaN/GaN structure and the third and fourth diodes are formed by a gated diode by connecting the gate to the source in a transistor structure to form the anode and the drain of the transistor structure formed the cathode of the diode.

Figure 1B:
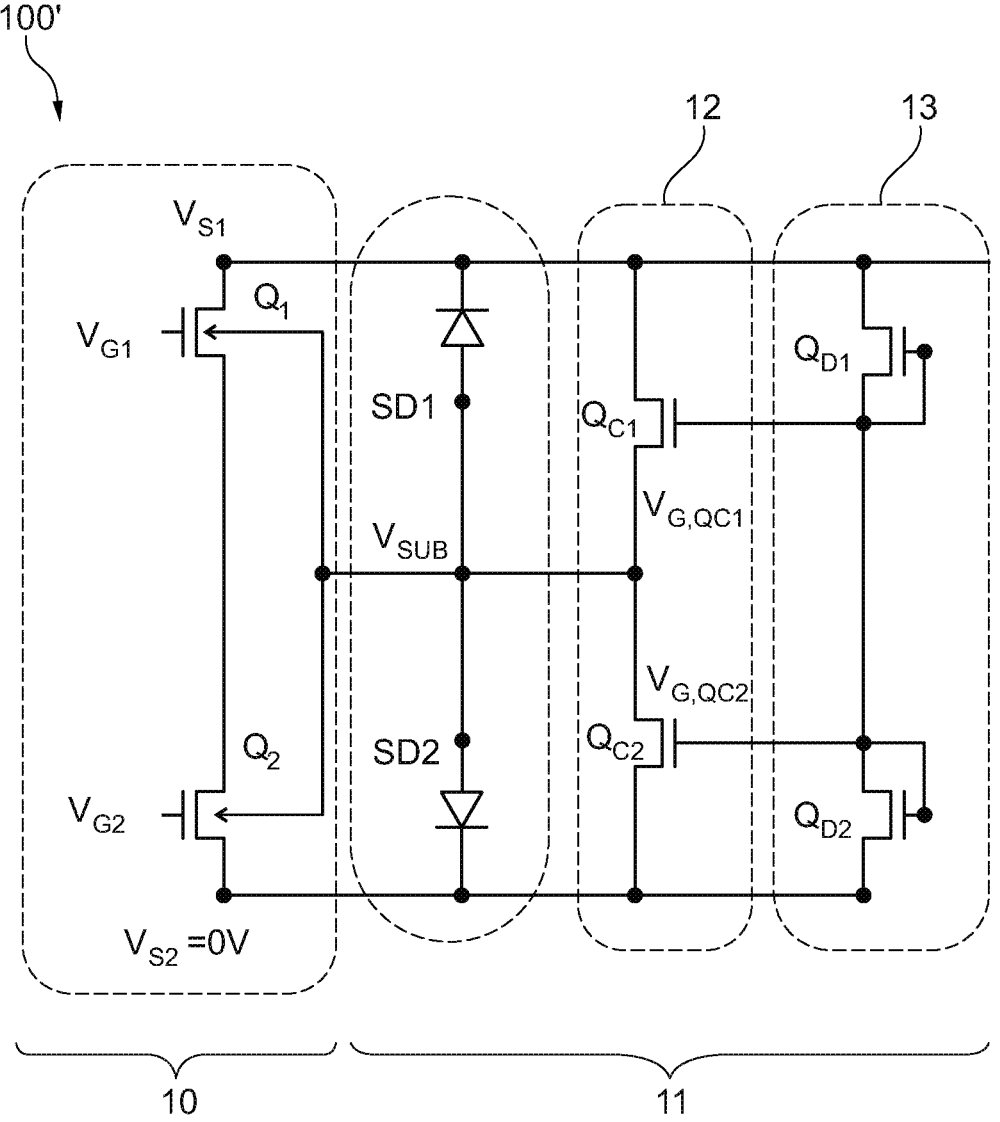
FIG. 1B illustrates a circuit diagram of a semiconductor device with a main bi-directional switch and a substrate control circuit according to an alternative embodiment.

FIG. 1B illustrates a semiconductor device 100' according to an alternative embodiment which also includes a main bi-directional switch 10 formed on a semiconductor substrate and a substrate control circuit 11 comprising a first diode SD1 and a second diode SD2, a discharge circuit 12 and a gate potential control circuit 13. The main bi-directional switch 10 and the substrate control circuit 11 of FIG. 1B may be monolithically integrated into the semiconductor substrate, in particular a Group III nitride body arranged on a base substrate.

The embodiment of FIG. 1B differs from that of FIG. 1A in the electrical connections between the gate potential control circuit 13 and the discharge circuit 12. In this embodiment, the anode of the third diode QD1 is connected to a first gate of the first transistor QC1 and the cathode of the third diode QD1 is connected to the first source of the main bi-directional switch 10 and VS1. The anode of the fourth diode QD2 is connected to a second gate of the second transistor QC2 and the cathode of the fourth diode QD2 is connected to the second source of the main bi-directional switch 10 and VS2.

Figure 2A:
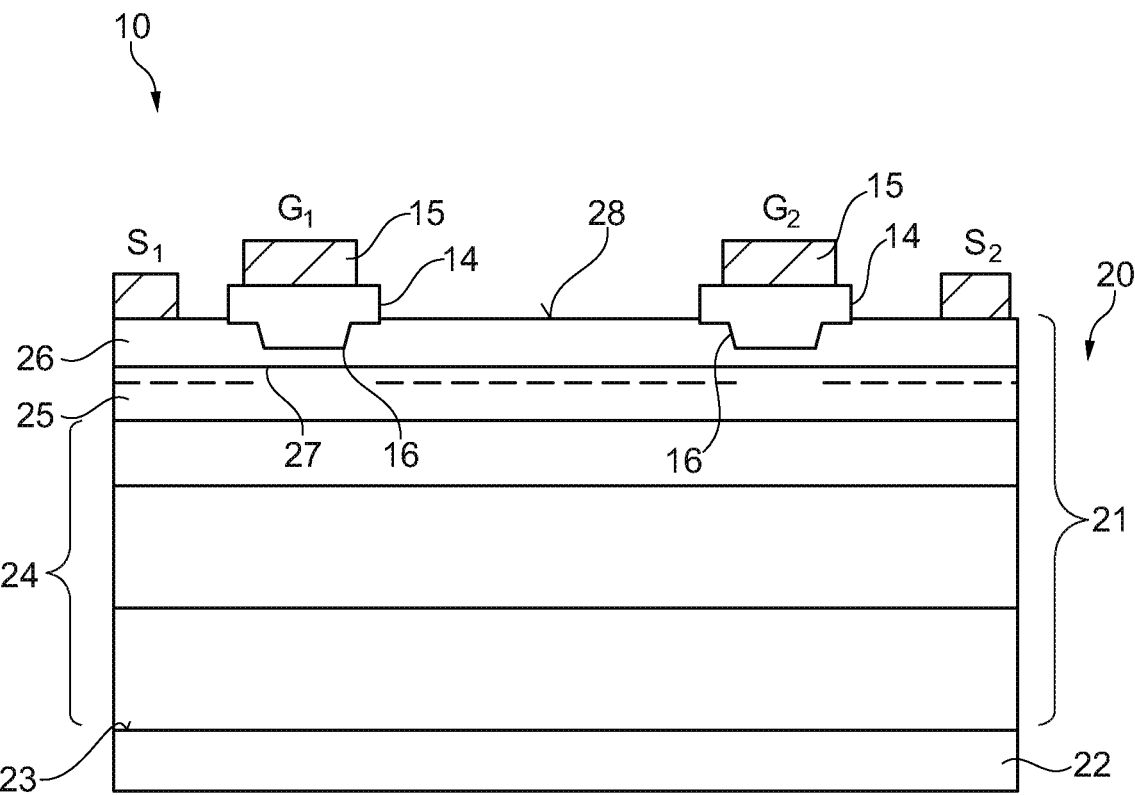
FIG. 2A illustrates a cross-sectional view of the main bi-directional switch according to an embodiment.
Figure 2B:
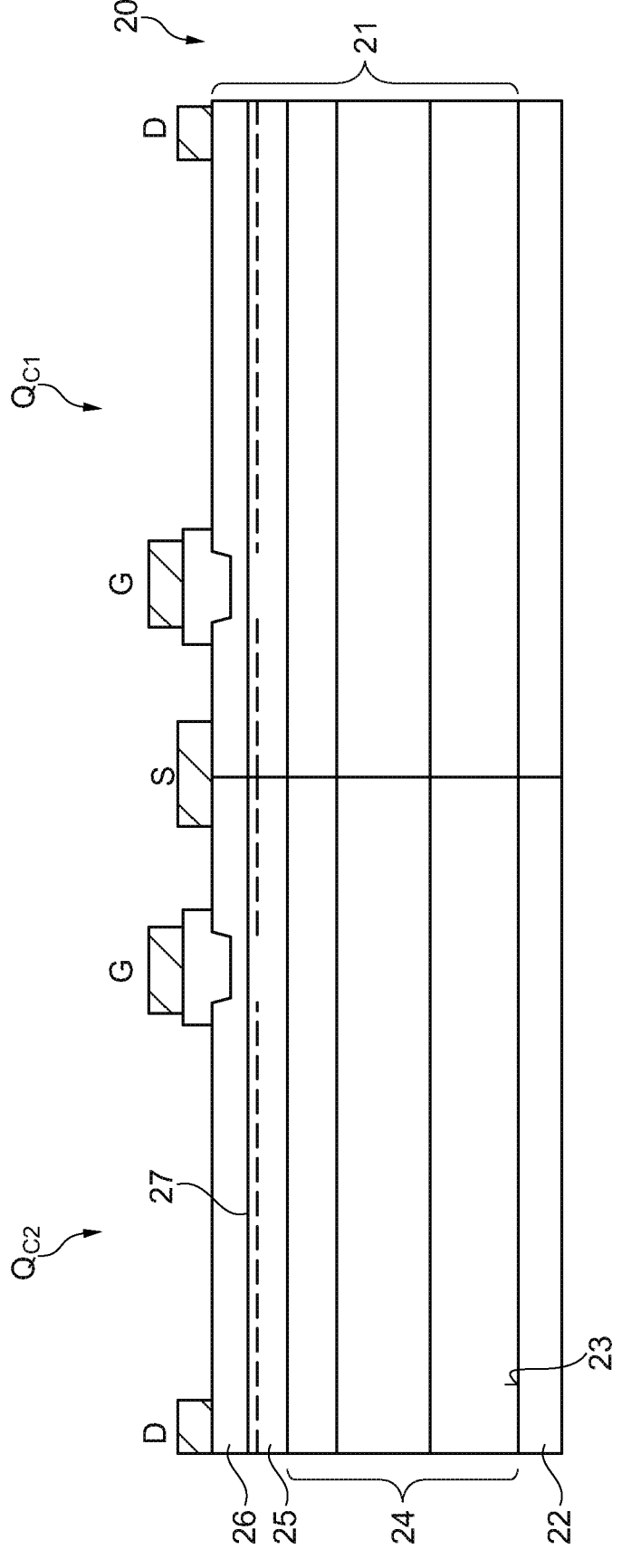
FIG. 2B illustrates a cross-sectional view of a structure for the two transistor devices of the substrate control circuit according to an embodiment.

FIG. 2A illustrates a cross-sectional view of the bi-directional switch 10 and FIG. 2B illustrates a cross-sectional view of the transistor devices QC1 and QC2 of the semiconductor device 100, 100' having the circuit of FIG. 1A or FIG. 1B. The bi-directional switch 10 and the substrate control circuit 11 including the transistor devices QC1 and QC2 of the discharge circuit 12 are formed on the substrate 20 and are integrated into a common Group III nitride body 21 formed on a base substrate 22.

FIG. 2A illustrates a cross-sectional view of a portion of the semiconductor device 100, 100' in which the bi-directional switch 10 is formed and shows the structure of the semiconductor substrate 20. The semiconductor substrate 20 comprises a Group III nitride body 21 which is arranged on a base substrate 22. The Group IIII nitride body 21 has a multilayer structure and is arranged on an upper growth surface 23 of the base substrate 22. The upper growth surface 23 is capable of supporting the epitaxial growth of one or more Group III nitride-base layers. The layers of the Group III nitride body 21 are epitaxial layers. The Group IIII nitride body 21 comprises a buffer structure 24 on the base substrate 22, a GaN channel layer 25 on the buffer structure 24 and an AlGaN barrier layer 26 on the GaN channel layer 25 which forms a heterojunction 27 therebetween which supports a two-dimensional charge gas, such as a two-dimensional electron gas (2DEG), which is indicated in the drawings by a dashed line. In this embodiment, the AlGaN barrier layer 26 forms the upper surface 28 of the Group IIII nitride body 21.

In some embodiments, the base substrate 22 is a foreign substrate, i.e. is formed of a material other than Group III nitride materials, that includes the upper or growth which is capable of supporting the epitaxial growth of one or more Group III nitride-based layers. The base substrate 22 may be formed of silicon and may be formed of monocrystalline silicon or an epitaxial silicon layer, for example, or may be formed of sapphire, ceramic substrate, or SiC.

In some non-illustrated embodiments, the Group III nitride-based semiconductor body 21 may further include a back barrier layer. The channel layer 25 is formed on the back barrier layer and forms a second heterojunction with the back barrier layer and the barrier layer 26 is formed on channel layer 25. The back barrier layer has a different bandgap to the channel layer 25 and may comprise AlGaN, for example. The composition of the AlGaN of the back barrier layer may differ from the composition of the AlGaN used for the barrier layer 26.

A typical buffer structure 23 for a silicon base substrate 22 includes a AlN starting layer, which may have a thickness of several 100 nm, on the silicon substrate followed by a $Al_xGa_{(1-x)}N$ layer sequence, the thickness again being several 100 nm's for each layer, whereby the Al content of about 50-75% is decreased down to 10-25% before the GaN layer or AlGaN back barrier, if present, is grown. Alternatively, a superlattice buffer can be used. Again, an AlN starting layer on the silicon substrate is used. Depending on the chosen superlattice, a sequence of AlN and $Al_xGa_{(1-x)}N$ pairs is grown, where the thickness of the AlN layer and $Al_xGa_{(1-x)}N$ is in the range of 2-25 nm. Depending on the desired breakdown voltage the superlattice may include between 20 and 100 pairs. Alternatively, an $Al_xGa_{(1-x)}N$ layer sequence as described above can be used in combination with the above mentioned superlattice.

The bi-directional switch 10 includes a first source contact S1, a second source contact S2, a first gate G1 and a second gate G2 arranged on the upper surface 28 of the Group III nitride body 21. The first and second gates G1, G2 are arranged between the first and second source contacts 51, S2. In some embodiments, the each of the gates G1, G2 may include a p-doped region 14 arranged on the upper surface 28 and a metallic gate layer 15 arranged on the p-doped region 14. The p-doped region 14 may be a p-doped Group III nitride such as p-doped GaN or p-doped AlGaN. The p-doped region 14 is arranged at least partially in a recess 16 formed in the upper surface 28 of the barrier layer 26 such that the barrier layer 26 has a smaller thickness directly under the gate G1, G2 compared to the regions laterally adjacent the gates G1, G2. The p-doped region 14 and recess 16 may be used to form an enhancement mode device which normally off.

In other embodiments, the recess is omitted and the p-doped region 14 is arranged on the planar surface of the barrier layer 26 so that the barrier layer 26 has substantially the same thickness between the first and second source contacts S1, S2. In this embodiment, the device is normally on.

FIG. 2B illustrates a cross-sectional view of a structure that can be used to provide the two transistor devices QC1 and QC2 of the substrate stabilization structure 11 shown in FIGS. 1A and 1B that are also integrated into the Group III nitride body 21. The transistor devices QC1, QC2 each include a source S, a gate G and a drain D formed on the upper surface 28 of the Group III nitride body 21. The gate G is arranged between the source S and drain D and may have the same structure as the gate G used for the bi-directional switch 10, for example as shown and as described with reference to FIG. 2A. The sources S of the two transistors QC1 and QC2 are electrically connected to one another. In some embodiments, the arrangement may include a common source. The source S and the drain D are formed of a metal or alloy that forms an ohmic contact to the barrier layer. The metal of the gate G may be an ohmic metal or a Schottky metal.

The forward voltage of the first and second diode SD1, SD2 and the forward voltage of the third diode QD1 and fourth diode QD4 of the gate control circuit 13 may be adjusted by the design of that respective diode. In the circuit diagrams of FIGS. 1A and 1B, the first diode SD1 and the second diode SD2 are illustrated as two terminal devices and the third diode QD1 and the fourth diode QD2 are all illustrated as a gated diode, that is the diode comprises a transistor structure having a source, gate and drain. The gate is connected to the source to provide the anode and the drain provides the cathode.

However, the diodes and in particular the first diode SD1 and the second diode SD2 may have different structures, for example a two terminal diode structure such as a lateral diode structure, a PN diode or a Schottky diode or may comprise two or more diode stages coupled in series. A PN diode may be formed in the base substrate 22. In some embodiments, the first and second diode SD1, SD2 may be formed by a p-GaN/AlGaN/GaN structure.

Figure 3A:
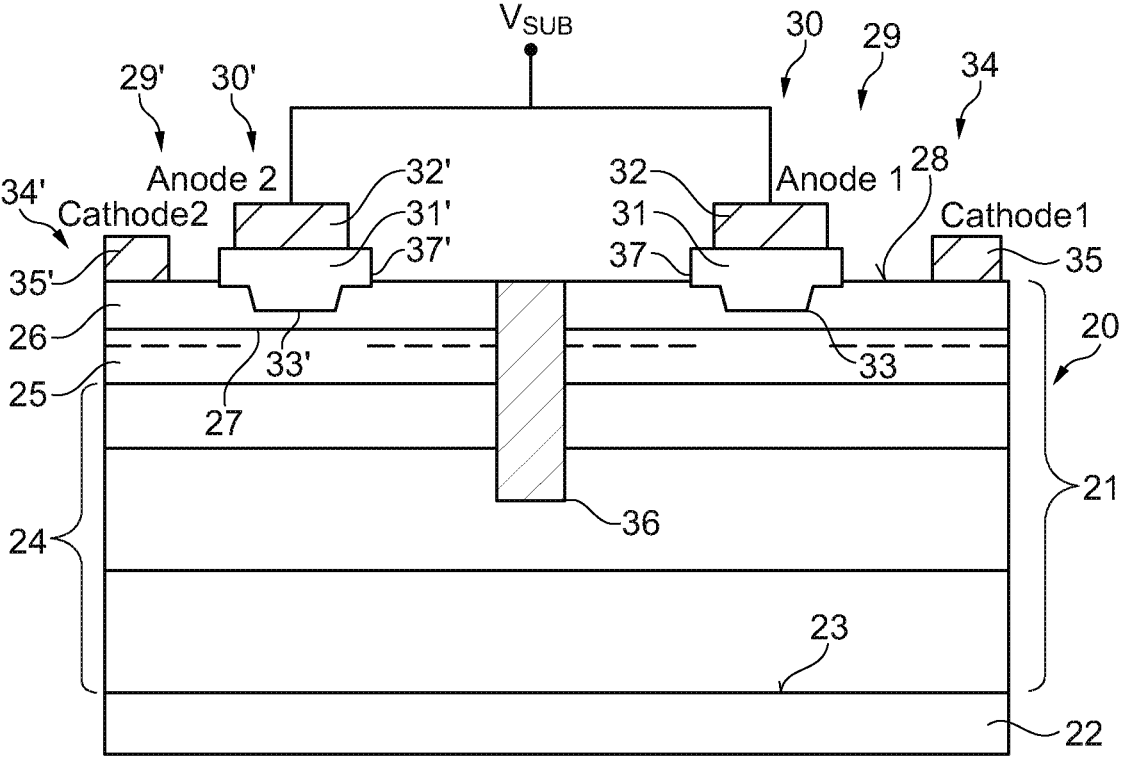
FIGS. 3A and 3B illustrate diode structures for the first and second diode of the substrate control circuit according to various embodiments.
Figure 3B:
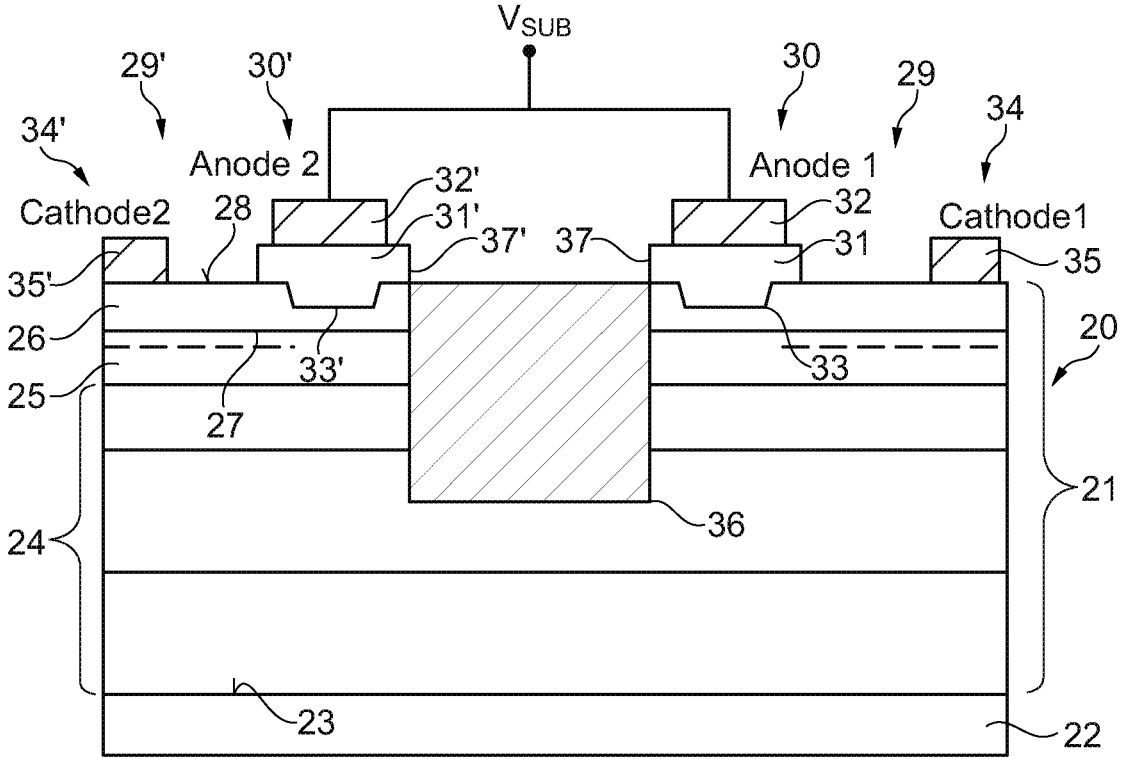

FIGS. 3A and 3B illustrate diode structures which may be used to form the first diode SD1 and the second diode SD2 of the substrate control circuit 11. FIG. 3A illustrates a portion of the semiconductor substrate 20 in which the structure of suitable for the first diode SD1 and the second diode SD2 is shown. The first diode SD1 and the second diode SD2 may be integrated into the semiconductor body 21 along with the bi-directional switch 10 and further devices of the substate control circuit 11.

A first diode 29, which may be used for the diode SD1, comprises an anode 30 which comprises a p-doped region 31 arranged on the upper surface 28 of the Group III nitride body 21 and a first electrode 32 arranged on the p-doped region 31. The p-doped region 31 may be formed of p-doped Group III nitride, for example p-doped GaN or p-doped AlGaN. In some embodiments, such as that illustrated in FIG. 3A, the p-doped region 31 is arranged in a recess 33 formed in the upper surface 28 so that the p-doped region 31 has a T-shape. The barrier layer 26 has a reduced thickness under the recess 33 compared to laterally adjacent the recess 33. The lateral extent of the first metallic electrode 32 may be substantially the same as or smaller than the maximum lateral extent of the p-doped region 31 on the first upper surface 28. The cathode 34 of the first diode 29 comprises a second metallic electrode 35 which is arranged on and in direct contact with the upper surface 28 of the Group III nitride body 21. The cathode 34 is spaced apart from the anode 30 by a region of the upper surface 28 of the Group III nitride body 21. The diode 29 can be considered to be a lateral diode. The second diode 29' has a similar structure and is arranged on the first surface 28 such that the second anode 30' is arranged laterally adjacent and spaced apart from the first anode 30.

The first and second anode 30, 30' are electrically connected to one another and to the substrate 22 and therefore VSUB. This arrangement can be described as a back-to-back arrangement. In this embodiment, the Group III nitride body 21 has a structure such that the first and second diodes 29, 29' are an enhancement mode device and are normally off as is indicated by the space in the dashed line representing the two-dimensional charge gas under the first anode 30 and second anode 30'.

In some embodiments, an isolation region 36 is provided which electrically separates the first diode 29 and the second diode 29' from one another by interrupting the two-dimensional charge gas. The isolation region 36 is positioned between the first anode 30 and the second anode 30'. In this embodiment, the first anode 30 and the second anode 30' are spaced apart from the isolation region 36 by a distance, i.e. the width of the isolation region 36 is less than the distance between the anodes 30, 30'.

The isolation region 36 may be formed by a trench formed in the first surface 28 which extends through the barrier layer 26 and channel layer 25 such that is its base is positioned within the buffer structure 24. In another embodiment, the isolation region 36 is formed by implantation to produce a discrete region with a disrupted and non-epitaxial crystal structure.

The isolation region 36 can be used between first and second diodes 29, 29' which are normally on (depletion mode) and normally off (enhancement mode). The isolation region 36 can, however, be omitted for first and second diodes 29, 29' which are normally off.

FIG. 3B illustrates a cross-sectional view of the semiconductor substrate 20 which shows an alternative arrangement of the first and second diode 29, 29' which differs from that illustrated in FIG. 3A in the size of the isolation region 36. In this embodiment, the isolation region 36 has a greater width and extends between the facing side faces 37, 37' of the respective p-doped regions 31, 31' of the first and second anode 30, 30', i.e. the width of the isolation region 36 is substantially the same as the distance between the anodes 30, 30'.

Figure 4:
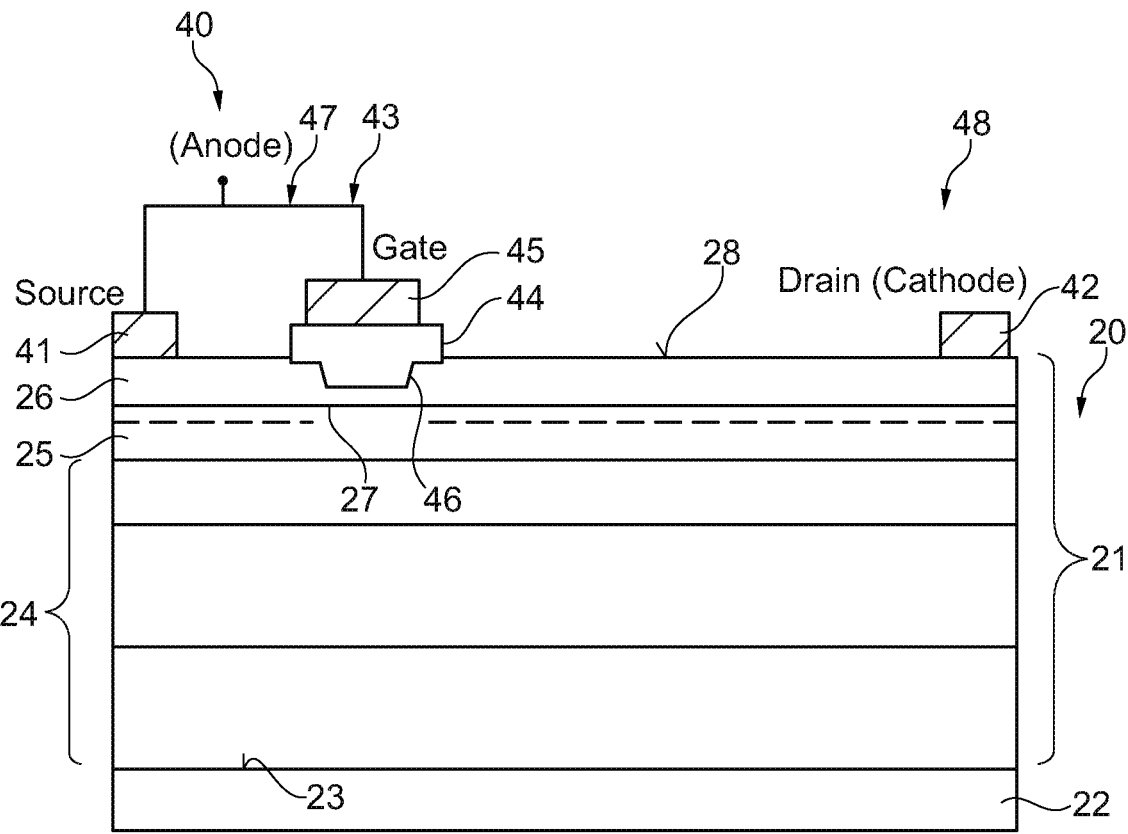
FIG. 4 illustrates a cross-sectional view of a structure for the third and fourth diodes of the gate potential control circuit according to an embodiment.

FIG. 4 illustrates a cross-sectional view of the semiconductor substrate 20 which shows a structure which is suitable for forming the third diode QD1 and the fourth diode QD2. The third diode QD1 and the fourth diode QD2 may be integrated into the Group III nitride body 21 along with the bi-directional switch 10 and some or all of the further switching devices of the substrate control circuit 11 shown in FIGS. 1A and 1B.

The diode 40 is suitable for forming the third diode QD1 and the fourth diode QD2 and has a gated diode structure. The diode 40 has a source contact 41 and a drain contact 42 which are formed on the upper surface 28 of the semiconductor body 21 and a gate 43 which is arranged laterally between and spaced apart from the source contact 41 and the drain contact 42. The gate 43, in this embodiment, comprises a p-doped region 44 arranged on the upper surface 28 of the Group III nitride body 21 and a metallic gate 45 arranged on the p-doped region 44. The p-doped region 44 may be formed of p-doped Group III nitride, for example p-doped GaN or p-doped AlGaN. The gate 43 may also have a recess structure in which the p-doped region 44 is at least partially arranged in a recess 46 formed in the upper surface 28 such that the p-doped region 44 has a T-shape and the barrier layer 26 has a reduced thickness under the recess 46. The structure of the gate 43 is suitable for forming an enhancement mode device which is normally off. The source contact 41 and the drain contact 42 may be formed of an ohmic metal, that is a metal which forms an ohmic contact to the Group III nitride body 21, in particular the barrier layer 26 with which they are in contact. The source 41 and the metal gate 45 are electrically connected to one another and form the anode 47 of the gated diode structure. The drain contact 42 provides the cathode 48 of the gated diode structure.

In some embodiments, the structure illustrated in FIG. 4 may also be used to provide the first diode SD1 and the second diode SD2, for example in embodiments in which each of the first and second diode SD1, SD2 comprises two or more diode stages connected in series, each diode stage may have the structure illustrated in FIG. 4.

FIGS. 5A to 5E illustrate cross-sectional views of the semiconductor substrate 20 and illustrates various structures for the first diode 29 and second diode 29' which may be used to form back-to-back diodes SD1 and SD2 in the circuit of FIGS. 1A-1B and 2A-2B. The first and second diodes 29, 29' may be integrated into the Group III nitride body 21 along with the bi-directional switch 10 and the switching devices of the substate control circuit 11, i.e. the transistors QC1, QC2 and the third and fourth diodes QD1, QD2. The structure of the diode will be described with reference to the first diode 29. The second diode 29' has a similar structure, and is the mirror image of the first diode 29 about the centre line of the isolation region 36 in the views of FIGS. 5A to 5D.

Figure 5A:
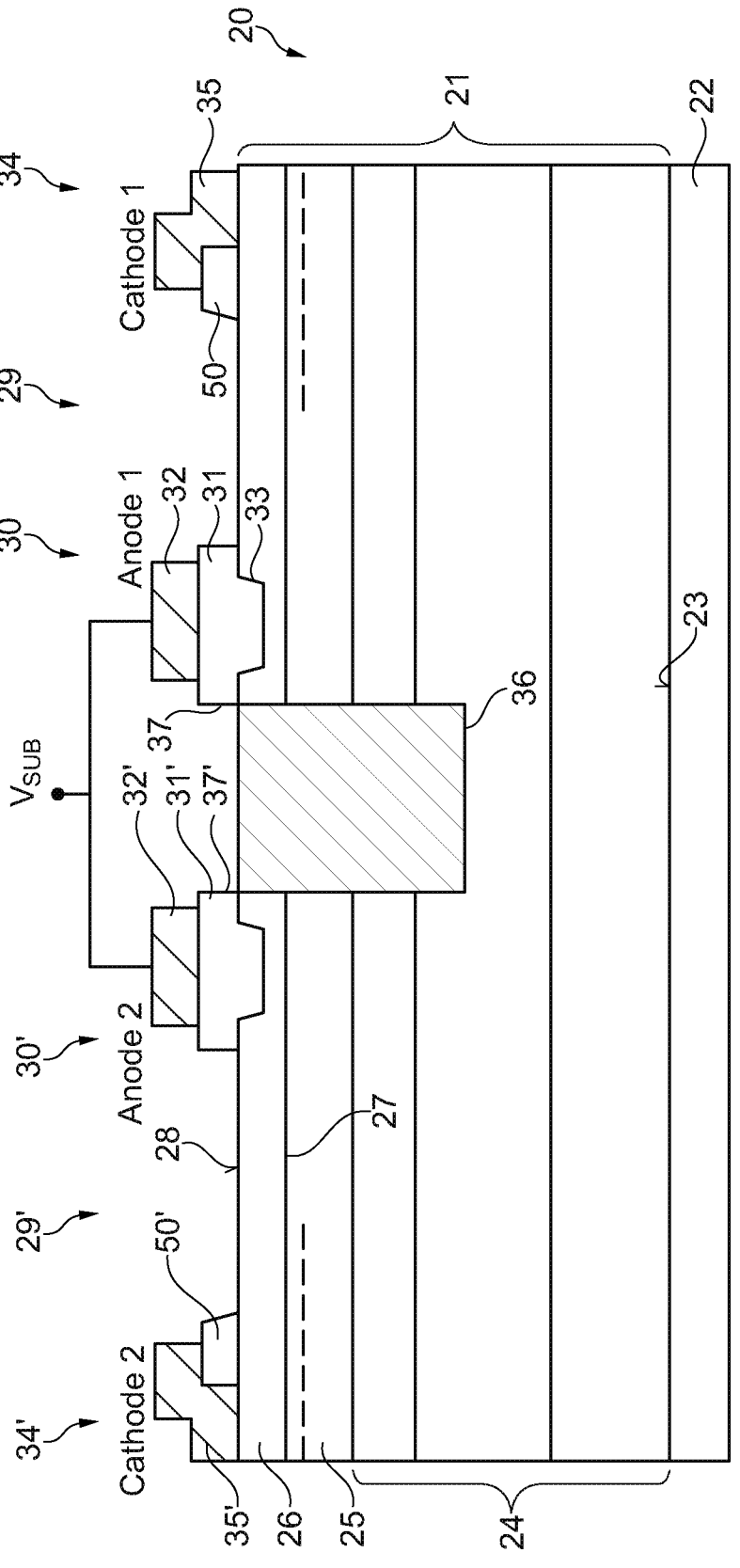
FIGS. 5A to 5E illustrate cross-sectional views of various structures for the first and second diode of the substrate control circuit according to various embodiments.

FIG. 5A illustrates an embodiment of the first and second diode 29, 29' which is similar to that illustrated in FIG. 3B but that differs from that illustrated in FIG. 3B in that the cathode 34 also comprises a p-doped region 50 which is positioned on the upper surface 28 of the barrier layer 26.

At least a portion of the metallic electrode 35 is in direct contact with the upper surface 28 of the Group III nitride body 21 and with the p-doped region 50. The p-doped region 50 is positioned laterally between the anode 30 and the portion of the cathode 34 in contact with the upper surface 28. In this embodiment, the metallic electrode 35 is in contact with the side face of the p-doped region 50 that faces away from the anode and also extends over a part of the upper surface of the p-doped region 50 and extends towards the anode 30.

The p-doped region 50 may be formed of a p-doped Group III nitride, such as p-doped GaN or p-doped AlGaN. The p-doped region 50 may be formed at the same time as the p-doped region 31 of the anode 30. In this embodiment, the isolation region 36 extends between and fills the entire space between the p-doped region 31 of the first anode 30 and the p-doped region 31' of the second anode 30'. However, in other embodiments, the isolation region 36 may occupy only part of this region such that the side faces 37, 37' are spaced apart from the isolation region 36 by an intervening portion of the upper surface 28, similar to the arrangement shown in FIG. 3A.

Figure 5B:
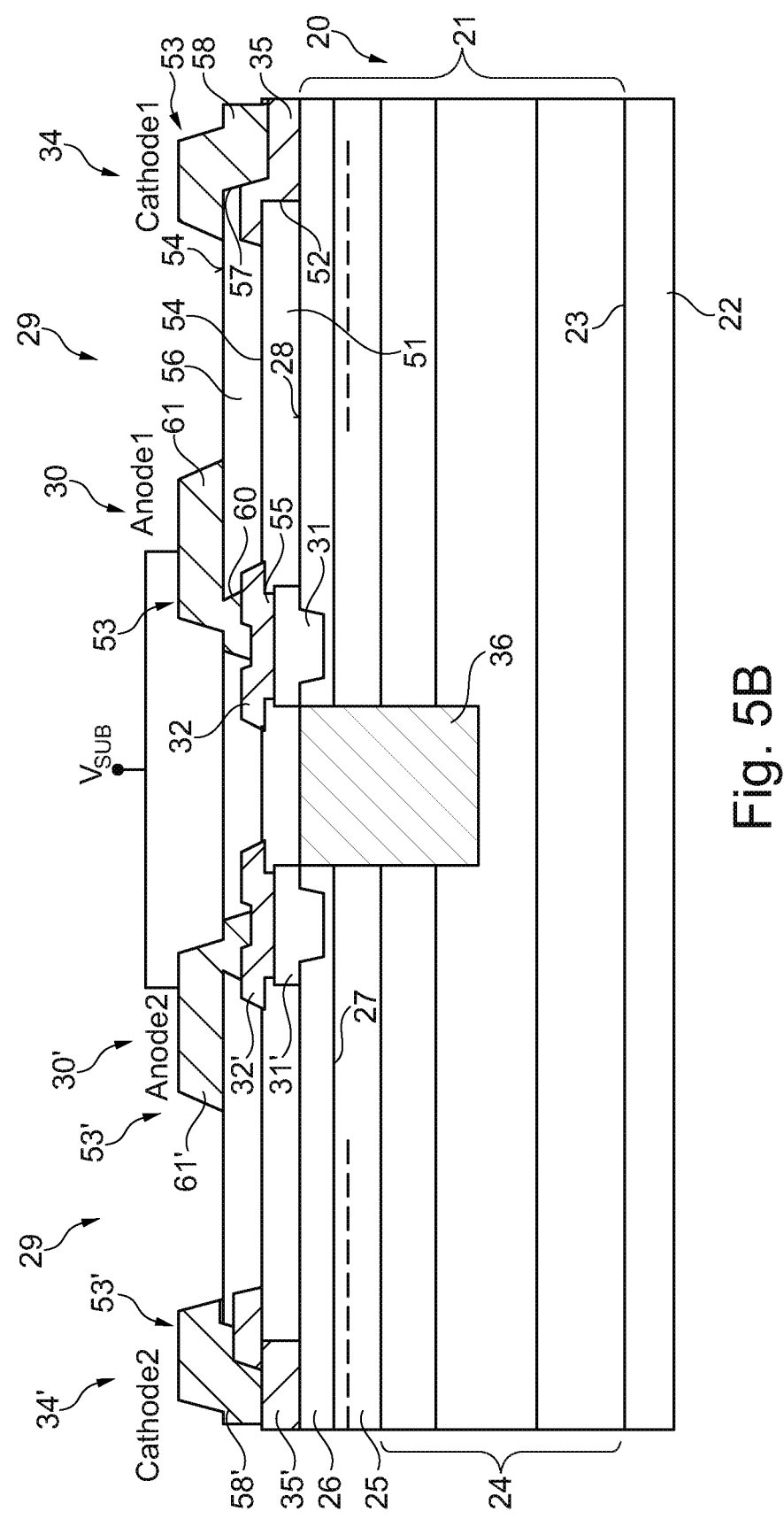

FIG. 5B illustrates an embodiment of the first and second diodes 29, 29' which is similar to that illustrated in FIG. 3A. In this embodiment, both the anode 30 and the cathode 34 further include a field plate structure 53. A first electrically insulating layer 51 is arranged on the upper surface 28 of the Group III nitride body 21. In some embodiments, the first insulating layer 51 initially covers the p-doped region 31 of the anode 30 which is fabricated first. To form the cathode 34, a first opening 52 is formed in the first insulating layer 51 and the second metallic layer 35 is formed in the opening 52 and is in direct contact with the upper surface 28 of the barrier layer 26. The second metallic layer 35 also extends over the upper surface 54 of the first insulating layer 51 towards the anode 30 to form a lateral extension which acts as a field plate.

To form the first metallic electrode 32 of the anode 30, a second opening 55 is formed in the first insulating layer 51 which is positioned above and has a base formed by the p-doped region 31 of the anode 30. The first metallic electrode 32 is formed in the opening 55 and extends over the upper surface 54 of the first insulating layer 51 in opposing lateral directions, i.e. towards the cathode 34 and the anode 30' of the second diode 29'. The lateral extensions of a third metallic electrode 61 and first metallic electrode 32 form the field plate structure 53.

The field plate structure 53 of the anode 30 provided by the extensions of the metallic electrode 61 serves to block the high voltage at the cathode from the p-doped region 31.

In some embodiments, the field plate structure 53 can be extended into a second layer. In these embodiments, as is illustrated in FIG. 5B, a second insulating layer 56 is deposited which covers the first insulating layer 51 and also the second metallic electrode 35 and first metallic electrode 32. A first opening 57 is formed for the cathode 34 which is positioned above the second metallic layer 35 and. in particular, above that portion of the second metallic layer 35 which is positioned directly on the upper surface 28 of the Group III nitride body 21. A fourth metallic layer 58 is formed which is positioned in the opening 58 and which extends over the upper surface 59 of the second electric insulating layer 56 towards the anode 30. This extension of the fourth metallic layer 58 is spaced apart from the extension of the second metallic electrode 35 by an intervening portion of the second electrically insulating layer 56.

An opening 60 is formed above the first metallic electrode 32 in the second electrically insulating layer 56 and the third metallic layer 61 is formed in the opening 60 which extends over the upper surface 59 of the second insulating layer 56 towards the cathode 30 and forms an extension. The extension of this layer 61 is spaced apart from the extension of the first metallic electrode 32 by intervening portion of the second electrically insulating layer 56. The extensions of the third and fourth metallic layers 61, 58 on the upper surface 59 of the second insulating layer 56 provide an extension to the field plate structure 53 of the extension of the first metallic layer 32 and second metallic layer 35, respectively. The first and second metallic layers 32, 35 may be formed by portions of the same deposited layer. Similarly, the third and fourth metallic layers 58, 61 may be formed by portions of the same deposited layer.

Figure 5C:
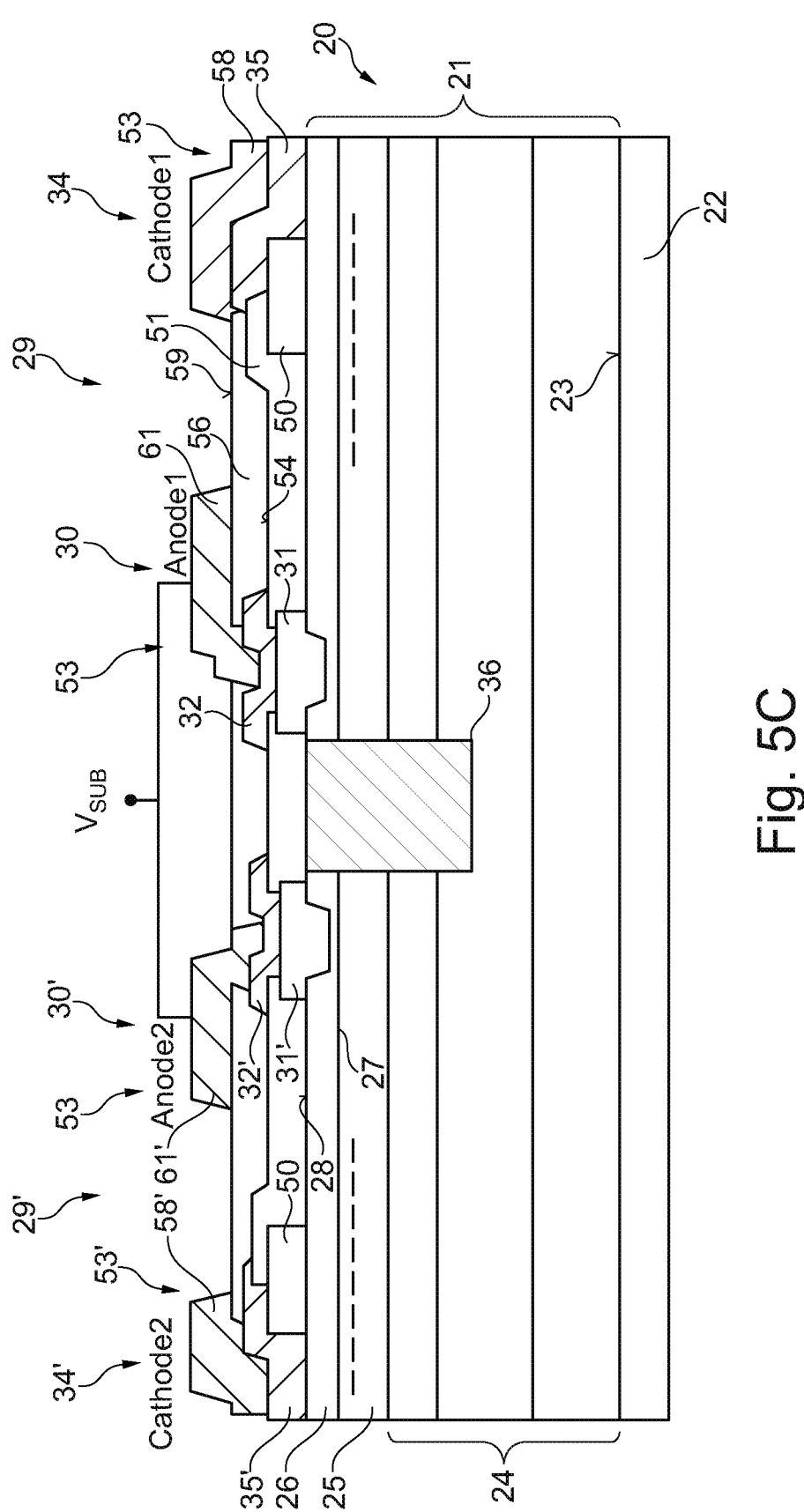

FIG. 5C illustrates an embodiment of the first and second diodes 29, 29' which is similar to that illustrated in FIG. 5B but differs in that the cathode 34, 34' of each of the first and second diode 29, 29' further includes a p-doped region 50 as in the embodiment illustrated in FIG. 5A. The p-doped region 50 may have a thickness which is corresponds substantially to the thickness of the p-doped region 31, 31' of the anode 30, 30'. The second metallic layer 35 is in direct contact with both the side face and upper surface of the p-doped region 50 and extends towards the anode 30 and so forms a field plate.

Figure 5D:
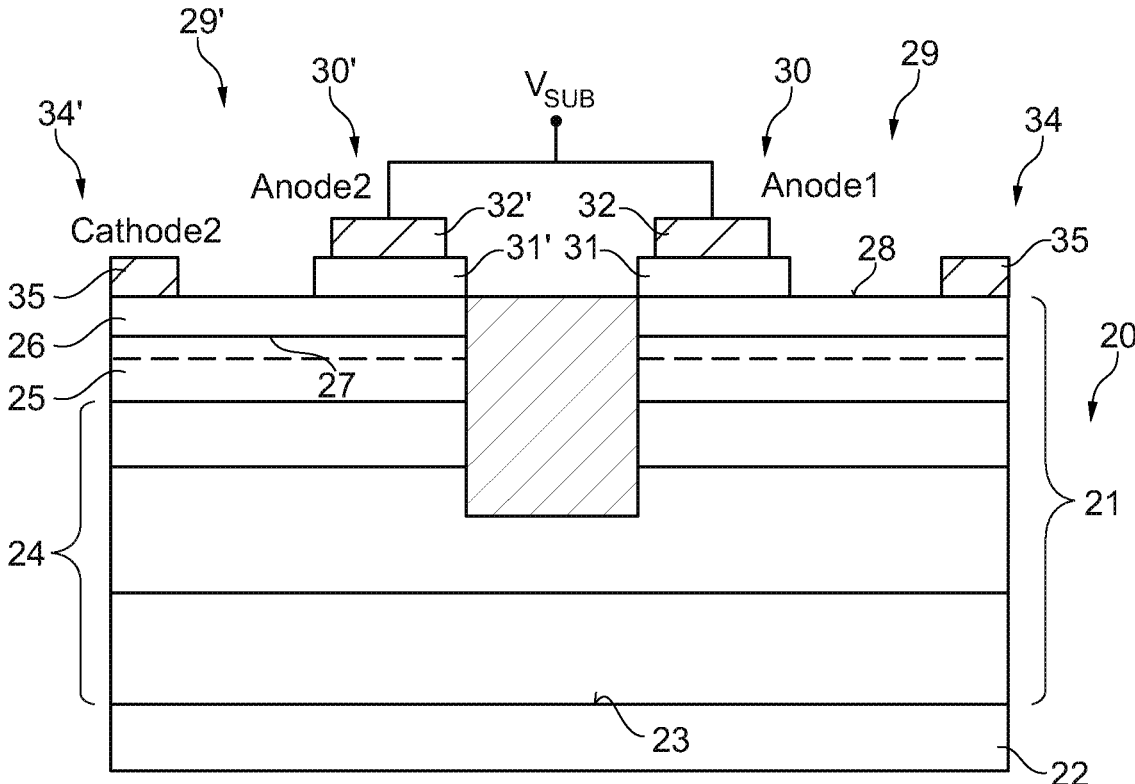

FIG. 5D illustrates another embodiment of the first and second diodes 29, 29' which is similar to that illustrated in FIG. 3B but differs in that the anode 30 does not have a recessed structure. The p-doped region 31 of each of the of the anode 30 has a planar structure and is positioned on the upper surface 28 of the Group III nitride body 21. The thickness of the barrier layer 26 is substantially the same between the cathodes 34, 34' of the two diodes 29, 29'. In this embodiment, the first and second diodes 29, 29' are normally on.

Figure 5E:
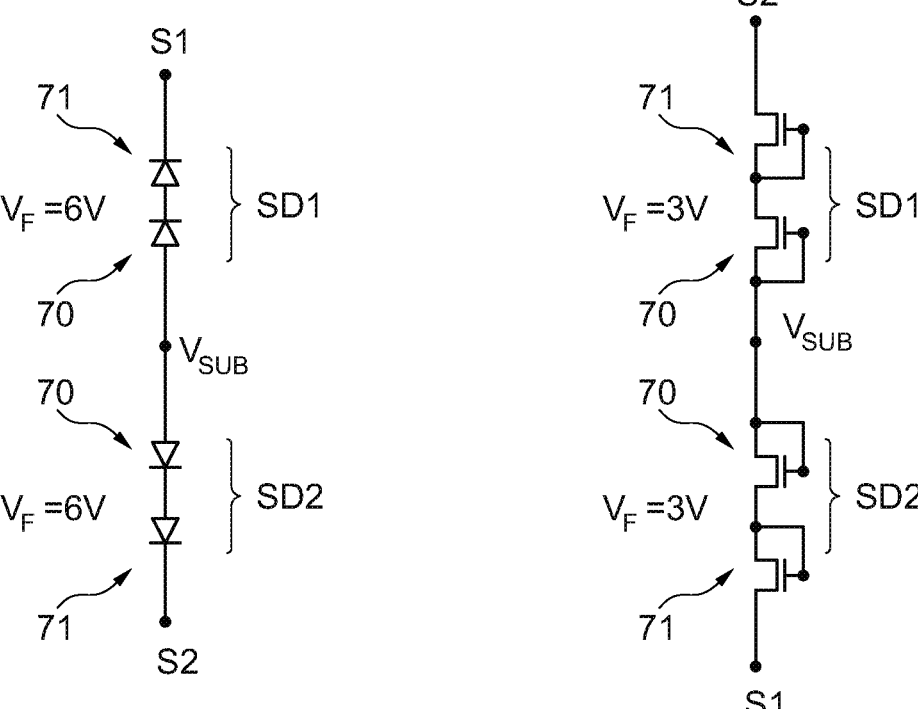

In some embodiments, one or both of the first diode SD1 and the second diode SD2 each comprise two or more diode stages. FIG. 5E illustrates an embodiment in which each of the first diode SD1 and the second diode SD2 includes two diode stages 70, 71 that are electrically connected in series. That is the cathode of first diode stage 70 is connected to the anode of the second diode stage 71. The anode of the first diode stage 70 is electrically connected to the base substrate and VSUB and the cathode of the second diode stage is electrically connected to the respective source terminal S1, S2. The two or more diode stages 70, 71 may be used to increase the forward voltage and to provide a forward voltage which is greater than the forward voltage of the third and fourth diodes QD1 and QD2.

The individual diode stages 70, 71 of one diode may have a two terminal diode structure, that is include an anode or cathode according to any one of the embodiments described herein, or may have a gated diode structure, that is have a transistor structure having a source gate and a drain with the gate connected to the source to provide the anode and the drain providing the cathode.

For example, if each diode stage has a forward voltage of 3V, two diode stages connected in series provide a total forward voltage of 6V. 3V is a typical forward voltage provided by a two terminal diode formed in the Group III nitride body according to one of the embodiments described herein. In another example, if each diode stage has a forward voltage of 1.5V, which is a typical forward voltage provided by a gated diode formed in the Group III nitride body according to one of the embodiments described herein, two diode stages connected in series provide a forward voltage of 3V.

Figure 6A:
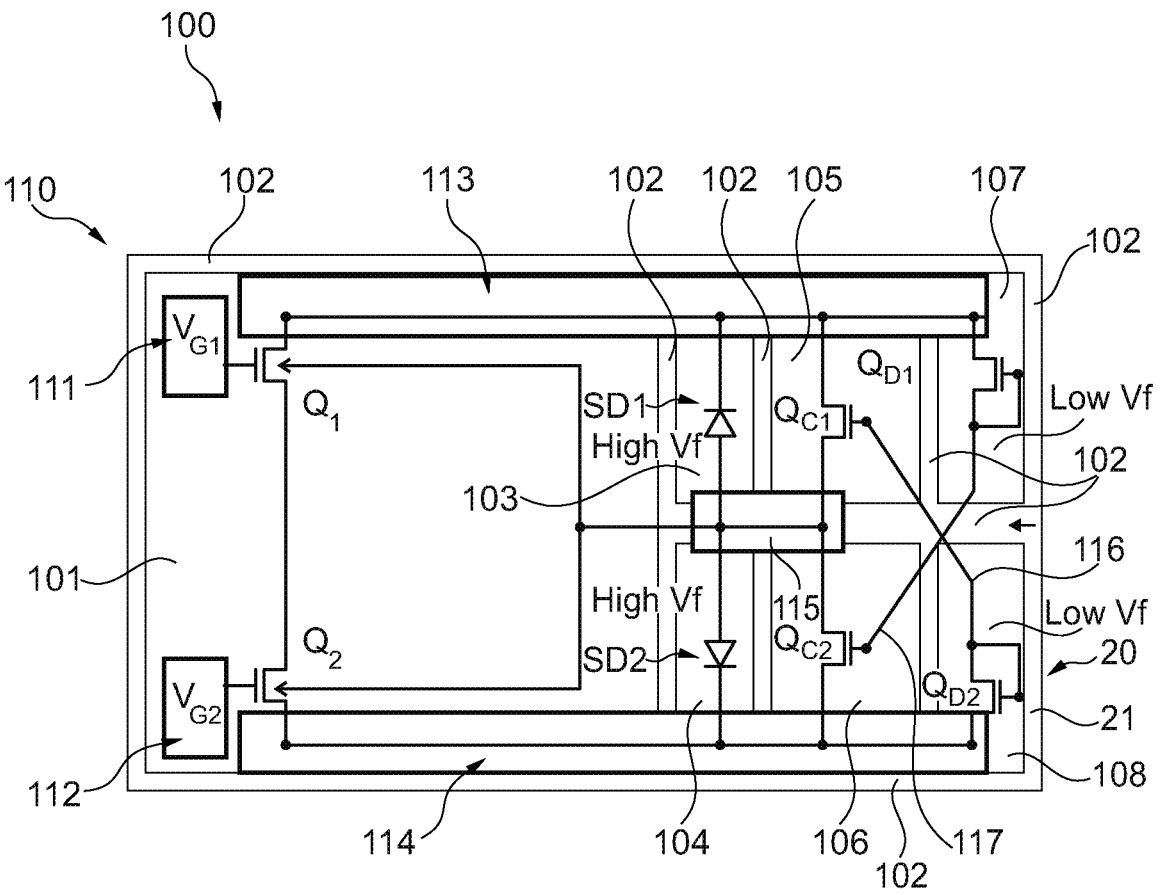
FIG. 6A illustrates a top view of a semiconductor device including a circuit with a main bi-directional switch and a substrate control circuit integrated within a common Group III nitride body.

FIG. 6A illustrates a top view of the semiconductor device 100 which includes a circuit with a main bi-directional switch 10 and a substrate control circuit 11 integrated within the common Group III nitride body 21. The substrate control circuit comprises a first diode SD1 and a second diode SD2, a discharge circuit 12 comprising a first transistor QC1 and a second transistor QC2 connected in a common source configuration and a gate potential control circuit 13 comprising a third diode QD1 and a fourth diode QD2 similar to the embodiments shown in FIGS. 1A and 1B. In the configuration of FIG. 6A, the anode of the third diode QD1 is connected to a second gate of the second transistor QC2 and the cathode of the third diode QD1 is connected to the first source S1 of the main bi-directional switch 10, and wherein the anode of the fourth diode QD2 is connected to a first gate of the first transistor QC1 and the cathode of the fourth diode is connected to the second source S2 of the main bi-directional switch 10. The first diode SD1 has a forward voltage $Vf_1$ and the third diode QD2 has a forward voltage $Vf_3$, wherein $Vf_1 \geq 1.1Vf_3$ or $Vf_1 \geq 1.2Vf_3$ or $Vf_1 \geq 1.5Vf_3$ or $Vf_1 \geq 2Vf_3$.

The bi-directional switch 10 of the semiconductor device 100 is formed in a first region 101 of the Group III nitride body 21 which is electrically isolated from the remainder of the Group III nitride body 21 by a continuous ring-shaped isolation region 102. The substrate control circuit 11 of the semiconductor device 100 is formed in a further six regions 103 to 108 of the Group III nitride body 21 each of which are electrically isolated from others by isolation regions 102 which are arranged in a grid to form three columns of two regions. The isolation regions 102 extend through the heterojunction 27 and may have the form of the isolation region 36 described with reference to FIG. 2A or 2B.

The first and second diodes SD1, SD2, the first and second transistors QC1, QC2 of the discharge circuit 12 and the third and fourth diodes QD1, QD2 of the gate potential circuit 13 may have the structure according to any one of the embodiments described herein.

The first diode SD1 is formed in the region 103, the second diode SD2 in the region 104 of the first column, the first transistor QC1 is formed in the region 105 laterally adjacent to the diode SD1 and the second transistor device QC2 in the region 107 of the second column. The third diode QD1 is formed in the region 107 and laterally adjacent the first transistor device QC1—such that the first transistor QC1 is arranged laterally between the first diode SD1 and the third diode QD1 in a first row. The fourth diode QD4 is arranged in the region 108 of the third column such that the second transistor QC2 is arranged laterally between the second diode SD2 and the fourth diode QD2 in a second row.

The semiconductor device 100 includes a metallisation structure 110 arranged on the top surface 28 which comprises a first gate pad 111 and second gate pad 112 for the bi-directional switch 10 and a first source pad 113 for the first voltage terminal VS1 and a second source pad 114 for the second voltage terminal VS2 shown in FIG. 1A. The first source pad 113 and the second source pad 114 are arranged on opposing sides of the upper surface 28 and which extend along the majority of the side such that such that the first source pad 113 is arranged on the Group III nitride areas 101, 103, 105, 107 and such that the second source pad 114 is arranged on the first Group III nitride portion 102, as well as the Group III nitride portions 104, 106, 108. The metallisation structure 110 also includes a contact pad 115 which is arranged laterally between the first and second source pads 113, 114 and between laterally between the first diode SD2 the second diode SD2 and between the first and second first transistor QC1 and second transistor QC2.

The anode of the first diode SD1 and the anode of the second diode SD2 and the source of each of the transistors QC1, QC2 are electrically connected to the contact pad 115. The contact pad 115 is electrically connected to the base substrate 22 and substrate potential VSUB. The contact pad 115 may be electrically connected to the base substrate 22 by a conductive via that extends through the Group III nitride body 21 or by a connector which extends between the contact pad 115 and a lead or die pad of a leadframe or pad of a higher-level substrate that is electrically connected to the base substrate 22. A solder connection between a rear side metallization of the base substrate 22 and the die pad can be used to electrically connect the base substrate 22 to the die pad.

The electrical connection between the anode of the third diode QD1 and the gate of the second transistor QC2 and the connection between the anode of the fourth diode QD2 and the gate of the first transistor QC1 may be formed by conductive traces 116, 117 of the metallisation structure 100 which are electrically insulated from the underlying Group III nitride body 21. The two connections may be made at least partially in different conductive sublayers of the metallisation structure 110 to allow the connections to cross whilst avoiding electrical connection between them.

Figure 6B:
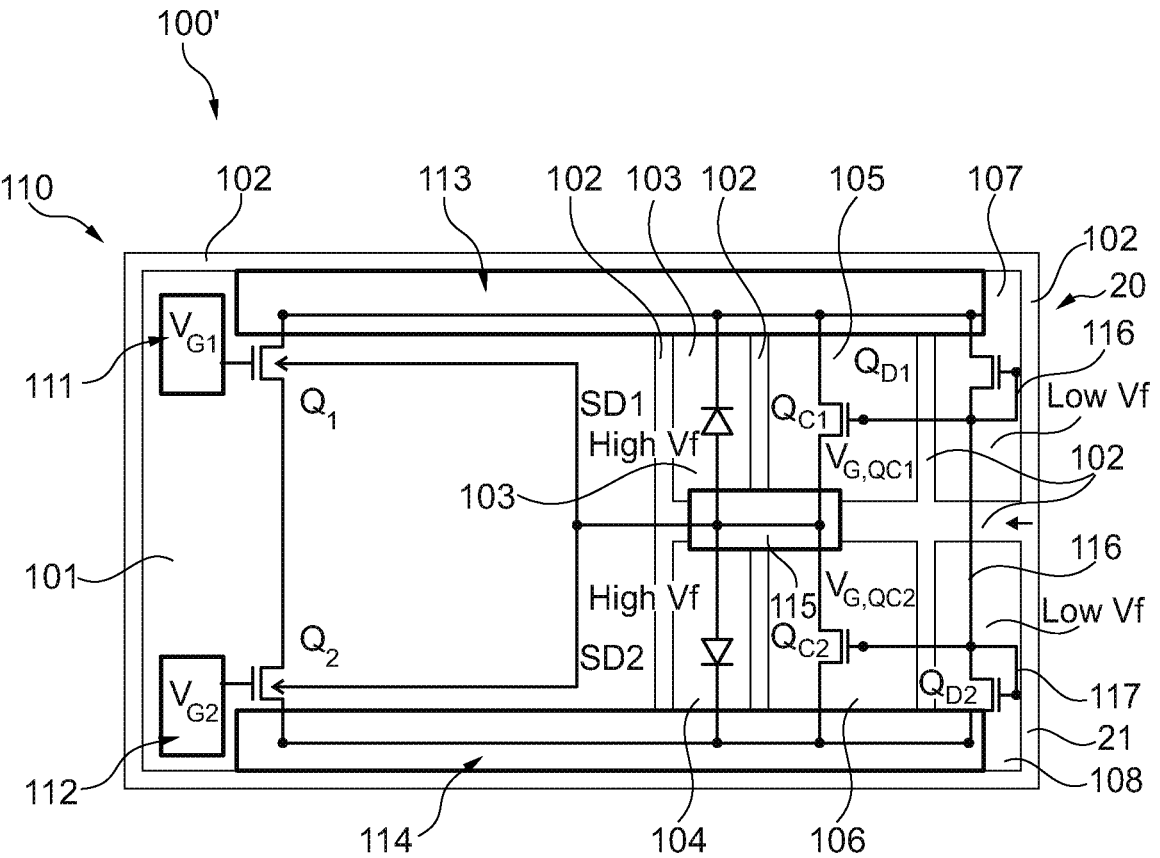
FIG. 6B illustrates a top view of a semiconductor device including the circuit illustrated in FIG. 1B integrated within a common Group III nitride body.

FIG. 6B illustrates a top view of the semiconductor device 100' including a bi-directional switch 10 and substrate stabilisation circuit 11 as illustrated in FIG. 1B that are integrated into the common Group III nitride body 21. The embodiment illustrated in FIG. 6B and differs from that of FIG. 6A only in the arrangement of the conductive traces 116, 117 of the metallization structure 110 between the anode of the third diode QD1 and the gate of the first transistor QC1 and between the connection between the anode of the fourth diode QD1 and the gate of the second transistor device QC2. In this embodiment, the conductive traces 116, 117 can be formed in the same sublayer and in a single sublayer of the metallization structure 110 as they do not cross one another.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise. It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a main bi-directional switch formed on a semiconductor substrate and comprising first and second gates, a first source electrically connected to a first voltage terminal, and a second source electrically connected to a second voltage terminal; and
a substrate control circuit, comprising:
a first diode and a second diode, wherein an anode of the first diode and an anode of the second diode are connected to the semiconductor substrate, wherein a cathode of the first diode is connected to the first source of the main bi-directional switch and a cathode of the second diode is connected to the second source of the main bi-directional switch;
a discharge circuit comprising a first transistor and a second transistor connected in a common source configuration to the semiconductor substrate, wherein a first drain of the first transistor is connected to the first source of the main bi-directional switch and a second drain of the second transistor is connected to the second source of the main bi-directional switch;
a gate potential control circuit comprising a third diode and a fourth diode,
wherein an anode of the third diode is connected to a second gate of the second transistor and a cathode of the third diode is connected to the first source of the main bi-directional switch, wherein an anode of the fourth diode is connected to a first gate of the first transistor and a cathode of the fourth diode is connected to the second source of the main bi-directional switch, wherein the first diode has a forward voltage $Vf_1$ and the third diode has a forward voltage $Vf_3$, wherein $Vf_1 \geq 1.1Vf_3$ or $Vf_1 \geq 1.2Vf_3$ or $Vf_1 \geq 1.5Vf_3$ or $Vf_1 \geq 2Vf_3$,
or
wherein the anode of the third diode is connected to a first gate of the first transistor and the cathode of the third diode is connected to the second source of the main bi-directional switch, wherein the anode of the fourth diode is connected to a second gate of the second transistor and the cathode of the fourth diode is connected to the first source of the main bi-directional switch, wherein the first diode has a forward voltage $Vf_1$ and the fourth diode has a forward voltage $Vf_4$, wherein $Vf_1 \geq 1.1Vf_4$ or $Vf_1 \geq 1.2Vf_4$ or $Vf_1 \geq 1.5Vf_4$ or $Vf_1 \geq 2Vf_4$,
or
wherein the anode of the third diode is connected to a first gate of the first transistor and the cathode of the third diode is connected to the first source of the main bi-directional switch, wherein the anode of the fourth diode is connected to a second gate of the second transistor and the cathode of the fourth diode is connected to the second source of the main bi-directional switch,
wherein the first diode has a forward voltage $Vf_1$ and the third diode has a forward voltage $Vf_3$, wherein $Vf_1 \geq 1.1Vf_3$ or $Vf_1 \geq 1.2Vf_3$ or $Vf_1 \geq 1.5Vf_3$ or $Vf_1 \geq 2Vf_3$.

2. The semiconductor device of claim 1, wherein the second diode has a forward voltage $Vf_2$ and the third diode has a forward voltage $Vf_3$, wherein $Vf_2 \geq 1.1Vf_3$ or $Vf_2 \geq 1.2Vf_3$ or $Vf_2 \geq 1.5Vf_3$ or $Vf_2 \geq 2Vf_3$ and/or $Vf_2 \geq 1.1Vf_4$ or $Vf_2 \geq 1.2Vf_4$ or $Vf_2 \geq 1.5Vf_4$ or $Vf_2 \geq 2Vf_4$.

3. The semiconductor device of claim 1, wherein $Vf_1 \geq 1.1Vf_3$ or $Vf_1 \geq 1.2Vf_3$ or $Vf_1 \geq 1.5Vf_3$ or $Vf_1 \geq 2Vf_3$ and $Vf_1 \geq 1.1Vf_4$ or $Vf_1 \geq 1.2Vf_4$ or $Vf_1 \geq 1.5Vf_4$ or $Vf_1 \geq 2Vf_4$.

4. The semiconductor device of claim 1, wherein the semiconductor substrate comprises a Group III nitride body arranged on a base substrate and the bi-directional switch, the first and second transistors, and the first, second, third and fourth diodes are monolithically integrated into the Group III nitride body.

5. The semiconductor device of claim 4, wherein the third diode and the fourth diode each comprise a transistor structure having a source, a gate, and a drain, wherein the anode is provided by the gate connected to the source and the cathode is provided by the drain.

6. The semiconductor device of claim 4, wherein the anode of the first diode and the anode of the second diode both comprise a p-doped region arranged on an upper surface of the Group III nitride body and a first metallic electrode arranged on the p-doped region, and wherein cathode of the first diode and the cathode of the second diode both comprise a second metallic electrode arranged on the upper surface of the Group III nitride body.

7. The semiconductor device of claim 6, wherein the first and second diode each further comprise a p-doped region coupled to the respective cathode.

8. The semiconductor device of claim 6, wherein the anode and/or cathode of each of the first and the second diode further comprises a field plate.

9. The semiconductor device of claim 6, wherein the p-doped region of the anode is at least partially arranged in a recess in the upper surface of the Group III nitride body.

10. The semiconductor device of claim 4, further comprising a metallization structure arranged on the upper surface of the Group III nitride body, wherein the metallization structure comprises a first voltage terminal pad providing the first voltage terminal, a second voltage terminal pad providing the second voltage terminal, and a substrate pad connected to the anode of the first diode, the anode of the second diode, and the common source of the first and second transistor.

11. The semiconductor device of claim 4, wherein the Group III nitride body comprises a multilayer structure comprising a Group III nitride channel layer and a Group III nitride barrier layer arranged on the Group III nitride channel layer and forming a heterojunction therebetween and capable of supporting a two-dimensional charge gas.

12. The semiconductor device of claim 1, further comprising an isolation region electrically insulating the first and second diodes from one another.

13. The semiconductor device of claim 1, wherein the first and the second diode are each a pn diode or a Schottky diode.

14. The semiconductor device of claim 1, wherein the first diode and the second diode each comprise two or more diode stages that are electrically connected in series to increase the forward voltage of the respective diode.

15. The semiconductor device of claim 1, wherein for both the first diode and the second diode, the diode comprises two or more diode stages that are electrically connected in series to increase the forward voltage of the diode, the diode further comprises a transistor structure having a source, a gate, and a drain, and the anode is provided by the gate connected to the source and the cathode is provided by the drain.

* * * * *